United States Patent [19]

Takasu

[11] Patent Number: 5,361,224

[45] Date of Patent: Nov. 1, 1994

[54] NONVOLATILE MEMORY DEVICE HAVING FERROELECTRIC FILM

[75] Inventor: Hidemi Takasu, Kyoto, Japan

[73] Assignee: Rohm Co., Ltd., Kiyoto, Japan

[21] Appl. No.: 21,848

[22] Filed: Feb. 24, 1993

[30] Foreign Application Priority Data

Mar. 3, 1992 [JP] Japan .................... 45790

[51] Int. Cl.5 ........................... G11C 11/40
[52] U.S. Cl. ...................... 365/145; 365/117;
    365/154; 365/156; 365/182; 365/190
[58] Field of Search ............... 365/145, 117, 154, 190,
    365/156, 181; 257/295, 296

[56] References Cited

U.S. PATENT DOCUMENTS

| | | | |
|---|---|---|---|
| 4,095,281 | 6/1978 | Denes | 365/156 |
| 4,132,904 | 1/1979 | Harari | 365/156 X |
| 4,161,038 | 7/1979 | Wu | 365/145 |
| 4,809,225 | 2/1989 | Dimmler et al. | |
| 4,873,664 | 10/1989 | Eaton, Jr. | |
| 4,888,630 | 12/1989 | Paterson | |
| 5,057,898 | 10/1991 | Adan et al. | 365/154 |

Primary Examiner—Eugene R. LaRoche
Assistant Examiner—Huan Hoang
Attorney, Agent, or Firm—Steven M. Rabin

[57] ABSTRACT

A nonvolatile memory device for storing data in a flip flop circuit comprising field effect transistors having respective ferroelectric gate films. A pair of writing/reading transistors is connected to the flip flop circuit. Each of the field effect transistors constituting the flip flop circuit retains its channel formation state because of a residual polarization in the ferroelectric gate film. Thus, when power goes OFF, the flip flop circuit retains its state just before power goes OFF. In this way, data can be stored on a nonvolatile basis, and stored data can be read without destroying the data. Additionally, no refreshing is needed, and therefore, a power demand in standby is reduced.

13 Claims, 13 Drawing Sheets

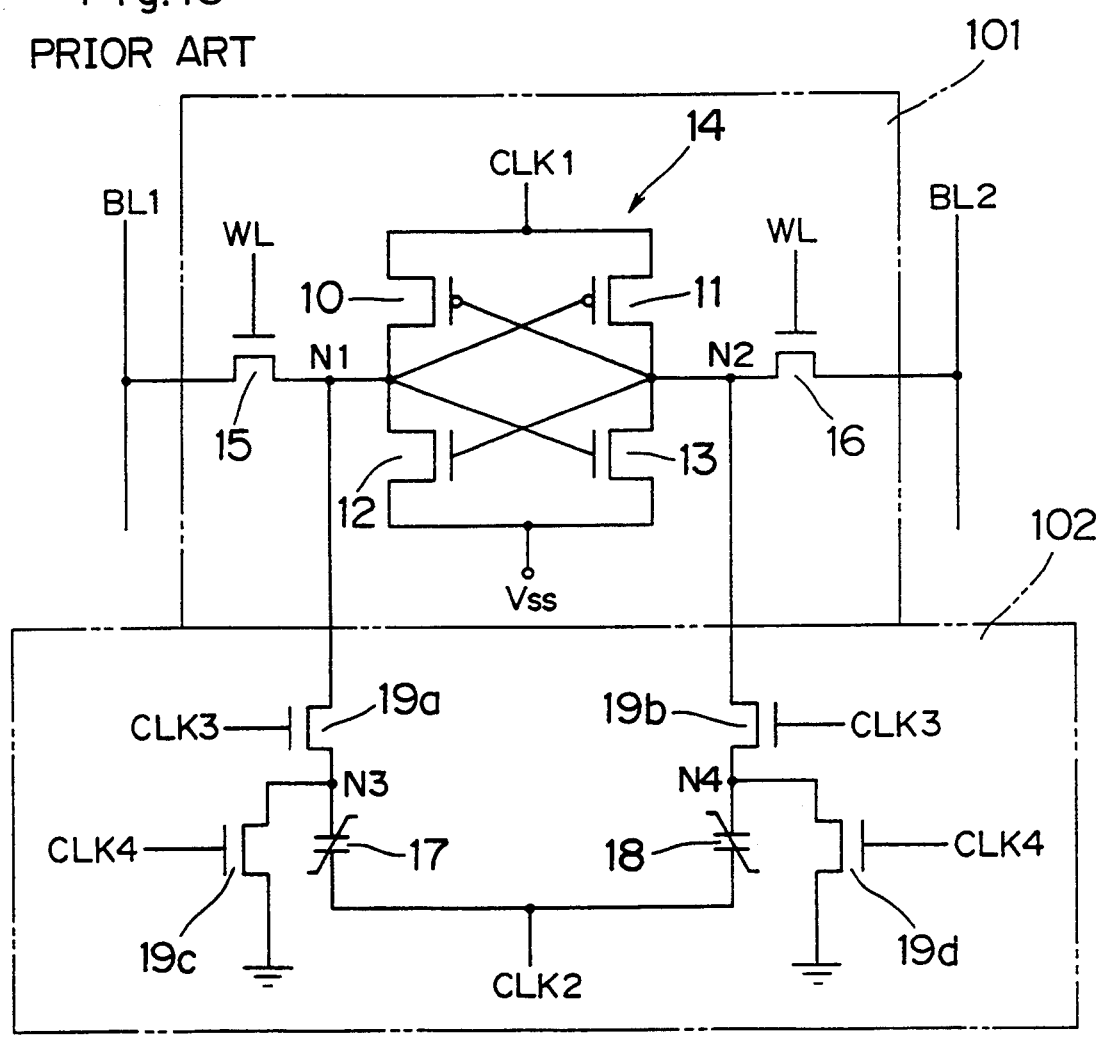

NONVOLATILE MEMORY DEVICE HAVING FERROELECTRIC FILM

BACKGROUND OF THE INVENTION

1. Field of the Invention

The present invention relates to a nonvolatile memory device in which a hysteresis characteristic of a polarization in ferroelectric substance related to an electric field is utilized.

2. Description of the Prior Art

When a sufficiently strong electric field is applied to ferroelectric substance like PZT (lead(Pb) Zirconate Titanate), a direction of a polarization is aligned to a direction of the electric field. This alignment still remains after the electric field is removed; that is, the polarization caused in the ferroelectric substance exhibits a hysteresis characteristic related to an applied electric field. Thus, a nonvolatile memory device, utilizing such a hysteresis characteristic, may be designed and fabricated.

The nonvolatile memory device using ferroelectric substance is, for example, disclosed in U.S. Pat. No. 4,873,664. In this nonvolatile memory device, each of memory cells arranged in a matrix manner on a semiconductor substrate has a circuit structure as shown in FIG. 12. Each memory cell includes two field effect transistors (FETs) 1 and 2, which have their respective gates connected to a word line WL and their respective drains connected to bit lines BL1 and BL2, respectively. Moreover, the FETs 1 and 2 have their respective sources connected to one of the plates of ferroelectric capacitors 3 and 4, respectively. The other plates of the ferroelectric capacitors 3 and 4 are connected to a line PLATE. A potential of the line PLATE is controlled by circuitry (not shown). In this way, the memory cell is similar in circuit structure to a memory cell of a DRAM (Dynamic Random Access Memory).

The ferroelectric capacitors 3 and 4 store complementary data; that is, when a polarization is caused in ferroelectrics of the ferroelectric capacitor 3 with its part close to the FET 1 assuming a positive polarity, a polarization is caused in ferroelectrics of the ferroelectric capacitor 4 with its part close to the FET 2 assuming a negative polarity. This state corresponds to a state of data "1" in storage, for example. In a state of data "0" in storage, the states of polarization in the ferroelectrics of the ferroelectric capacitors 3 and 4 are reversed.

In reading data, voltage at High level is applied to the line PLATE. Then, voltage is applied to the word line WL to turn the FETs 1 and 2 on, and the potential difference between the bit lines BL1 and BL2 at this time is amplified by a sense amplifier to read data. If, for example, the data "1" is stored in the memory cell, the polarization caused in the ferroelectric capacitor 3 is identical in direction to an electric field applied thereto. Thus, there is almost no change in the state of the ferroelectrics of the ferroelectric capacitor 3. However, the polarization caused in the ferroelectric capacitor 4 is reverse in direction to an electric field applied thereto. Hence, the direction of the polarization is inverted in the ferroelectric capacitor 4. This results in a potential of the bit line BL2 rising while that of the bit line BL1 is almost unchanged. Thus, by detecting the potential difference between the bit lines BL1 and BL2, the reading of stored data is attained.

In the ferroelectric capacitor 4, however, inversion of the polarization is caused, and therefore, a state of the memory cell varies from that before the reading of data; that is, stored data is destroyed.

Then, the sense amplifier applies voltage at High level to either one of the bit lines BL1 and BL2 which is higher in potential, and it applies voltage at Low level to the other. Under the condition, a potential of the line PLATE is inverted from High level into Low level. As a consequence, an electric field in a direction from the FET 2 toward the line PLATE is applied to the ferroelectric capacitor 4. This causes the direction of the polarization in the ferroelectric capacitor 4 to invert to the direction of the electric field, that is, the direction before the reading of data. In this way, self restoration is performed to reproduce stored data.

However, since the circuit structure of the memory cell is similar to that of the DRAM, electric charge accumulated in the ferroelectric capacitors 3 and 4 is reduced because of junction leakage current or transistor leakage current as time elapses, and sooner or later the stored contents are lost. To maintain the stored contents, refreshing must be implemented to reproduce the contents at fixed time intervals. The refreshing permits current to flow to charge/discharge the ferroelectric capacitors 2 and 3, and this causes the problem that a large power demand in standby is unavoidable.

Also, self restoration is required in the memory cell to reproduce data because the reading operation causes stored data to be destroyed, and this is why polarization inversion in ferroelectrics occurs so frequently. Thus, the ferroelectrics do not take long to deteriorate, and the problem arises that it is not reloadable so frequently. Usually more than $10^{12}$ occurrences of polarization inversion causes ferroelectrics to deteriorate, and the memory cell mentioned above which requires polarization inversion even in the reading of data may be reloadable extremely infrequently.

The prior art which solved these problems is disclosed in U.S. Pat. No. 4,809,225. A circuit structure of a memory cell employed in this prior art is shown in FIG. 13. The memory cell includes a volatile portion 101 and a nonvolatile portion 102. The volatile portion 101 has a circuit structure similar to that of a memory cell of an SRAM (Static Random Access Memory). For example, the volatile portion 101 has a flip flop circuit 14 consisting of P channel FETs 10, 11 and N channel FETs 12, 13 to store data. A data writing/reading FET 15 is coupled between the flip fop circuit 14 and a first bit line BL1. Similarly, a data writing/reading FET 16 is coupled between the flip flop circuit 14 and a second bit line BL2. In writing data, complementary data are applied to the bit lines BL1 and BL2. The FETs 15 and 16 have their respective gates connected to a word line WL.

A node N1 between the flip flop circuit 14 and the writing/reading FET 15 is connected in series with a FET 19a and a ferroelectric capacitor 17 contained in the nonvolatile portion 102. Similarly, a node N2 between the flip flop circuit 14 and the writing/reading FET 16 is connected in series with a FET 19b and a ferroelectric capacitor 18 contained in the nonvolatile portion 102. Nodes N3 and N4 between the ferroelectric capacitors 17, 18 and the FETs 19a, 19b are connected to shorting transistors 19c, 19d, respectively.

In an ordinary operation, a logic signal CLK3 causes the transistors 19a and 19b to turn off, and the logic signal CLK1 is kept at High level. This allows the nonvolatile portion 102 to be electrically disconnected from the volatile portion 101, the whole memory device including this memory cell functions as an SRAM.

Just before power goes OFF, a logic signal CLK4 is kept at Low level to turn the transistors 19c and 19d off while the logic signal CLK3 is kept at High level to turn the transistors 19a and 19b on. This permits the ferroelectric capacitors 17 and 18 to be charged. Under this condition, a logic signal CLK2 is kept at Low level for a certain period of time and then kept at High level for the succeeding period of time. If the node N1 is at High level while the node N2 is at Low level, a polarization is caused in ferroelectrics of the ferroelectric capacitor 17 with its part close to the node 1 assuming a positive polarity, and a polarization is caused in ferroelectrics of the ferroelectric capacitor 18 with its part closed to the node 2 assuming a negative polarity. These polarizations are retained after power goes OFF. Thus, maintenance of data can be effected during a power interruption by transferring data in the volatile portion 101 to the nonvolatile portion 102.

When power is ON, the logic signals CLK 3 and CLK4 are kept at High level to precharge the nodes N1 and N2 with 0 volt, and thereafter, the logic signal CLK 4 turns to Low level. This allows voltage developed in the ferroelectric capacitors 17 and 18 to be applied to the nodes N1 and N2, respectively. In this way, data accumulated in the nonvolatile portion 102 is transferred to the volatile portion 101.

In this prior art technology, the circuit structure of the memory cell is similar to that of a memory cell of an SRAM, and therefore, no refreshing is needed. This leads to less power demand in standby. The polarization caused in ferroelectrics of the ferroelectric capacitors 17 and 18 is not inverted for a period while power is ON and an ordinary operation is carried out. Hence, the number of times the memory cell is reloadable is not decreased.

However, the memory cell in FIG. 13 includes six transistors in the volatile portion 101 and four transistors and two capacitors in the nonvolatile portion 102. Thus, compared with an ordinary SRAM, an extra four transistors and two capacitors are required per cell. This leads to a requirement of an increased cell area, and accordingly the resultant memory cell costs much more. In addition to that, a control circuit for controlling connection/disconnection between the volatile portion 101 and the nonvolatile portion 102 is required, and the problem arises that its structure is complicated

SUMMARY OF THE INVENTION

It is an object of the present invention to provide a nonvolatile memory device where a power demand in standby can be reduced.

It is another object of the present invention to provide a nonvolatile memory device capable of reading data without destroying it.

It is still another object of the present invention to provide a nonvolatile memory device where the whole formation area can be reduced.

It is yet another object of the present invention to provide a nonvolatile memory device having a simplified structure.

In a nonvolatile memory device according to the present invention, a flip flop circuit for storing data consists of four field effect transistors each having a ferroelectric gate film. The flip flop circuit has its first and second terminals connected to data writing/reading field effect transistors, respectively.

In the above mentioned arrangement, a state of a channel of each field effect transistor in the flip flop circuit is determined by a state of the polarization in the ferroelectric gate film. The state of the polarization in the ferroelectric gate film goes retained after power goes OFF, and hence, the state of the flip flop circuit, after power interruption, is kept unchanged from the state just before the power interruption. In this way, data can be stored in the flip flop circuit in a nonvolatile manner.

Also, because the circuit structure is similar to that of a memory cell of a SRAM, no refreshing is needed to reproduce stored data. Thus, a power demand in standby can be reduced.

Additionally, data stored in the flip flop circuit can be read without applying to gates of the four field effect transistors voltage by which the polarization in each ferroelectric gate film is inverted. Thus, stored data is not destroyed in reading.

Furthermore, since there is no need of providing a ferroelectric capacitor and so forth for accumulating electric charge other than the flip flop circuit, a formation area of the memory device can be considerably reduced, and additionally its structure is simplified.

The above and other objects, features and advantages of the present invention will become more fully apparent from the following detained description of the preferred embodiments when taken in conjunction with the accompanying drawings.

BRIEF DESCRIPTION OF THE DRAWINGS

FIG. 13 is a circuit diagram showing a structure of another prior art memory cell similar in circuit arrangement to a memory cell of an SRAM.

DESCRIPTION OF THE PREFERRED EMBODIMENTS

Figure 1:
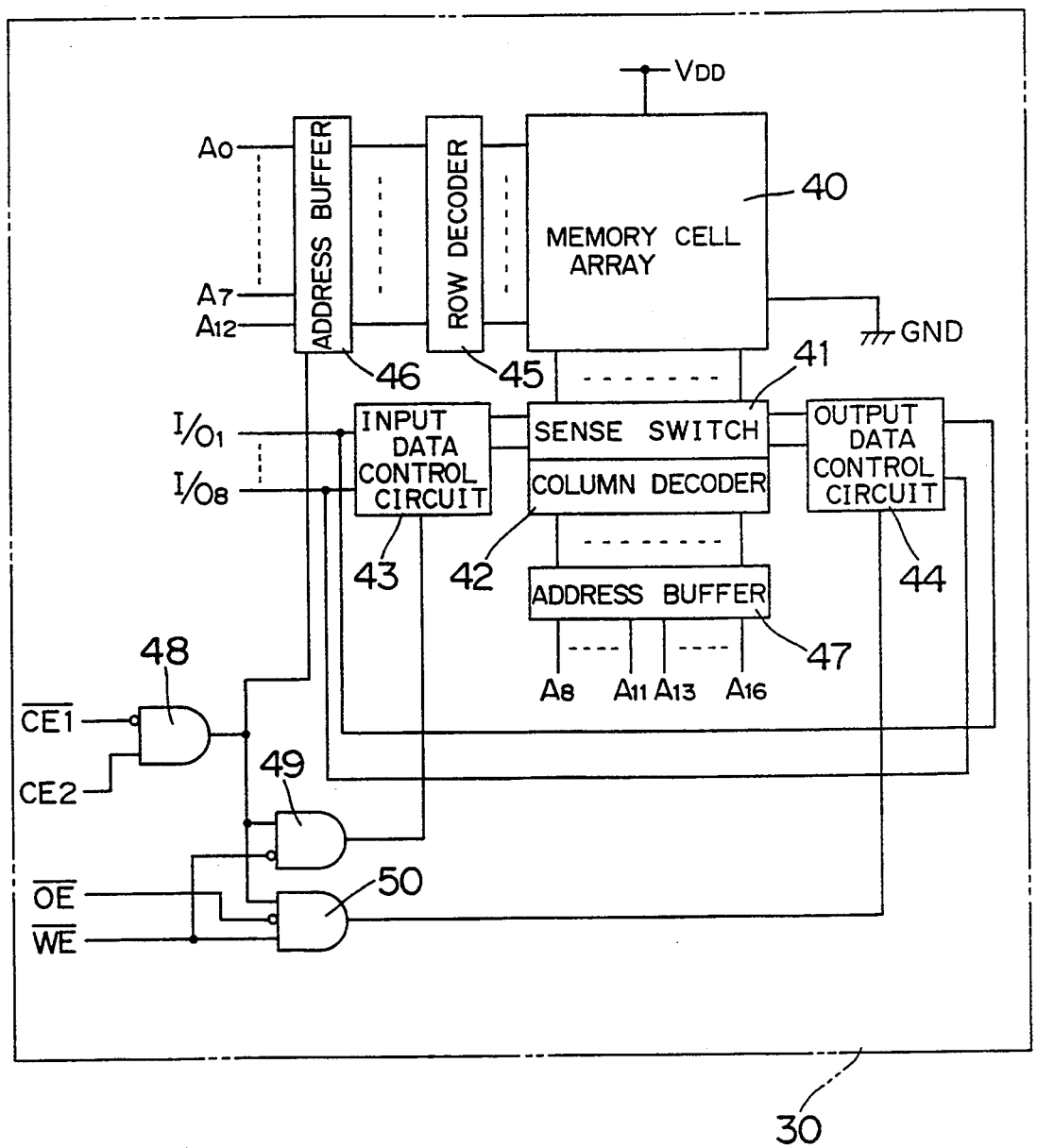
FIG. 1 is a block diagram showing a basic structure of a nonvolatile memory device of a first preferred embodiment according to the present invention.

FIG. 1 is a block diagram showing a basic structure of a nonvolatile memory device of a first preferred embodiment according to the present invention. In FIG. 1, although terminals to or from which a signal of a negative logic is input or output are denoted by alphanumeric symbols with overline, such overline is omitted in the text herein.

The nonvolatile memory device, which is formed on a semiconductor substrate 30, includes a plurality of memory cells each of which can store single bit data, and those memory cells disposed in a matrix manner constitute a memory cell array 40. The memory cell array 40 is connected to a row decoder 45, a sense switch 41 and a column decoder 42, respectively, for selection of any of the memory cells. The row decoder 45 selects a row of the memory cells in the memory cell array 40 based upon address signals which are held by an address buffer 46 after being received on address input terminals $A_0$ to $A_7$ and $A_{12}$. Similarly, the column decoder 42 and the sense switch 41 select a column of the memory cells in the memory cell array 40 based upon address signals which are held by an address buffer 47 after being received on address input terminals $A_8$ to $A_{11}$ and $A_{13}$ to $A_{16}$. In this way, one of the memory cells disposed at an intersection of the row selected by the row decoder 46 and the column selected by the column decoder 42 and the sense switch 41.

The sense switch 41 is connected to an input data control circuit 43 and an output data control circuit 44, respectively. The input data control circuit 43 controls input of data received on data input/output terminals $I/O_1$ to $I/O_8$ to the memory cell array 40. The output data control circuit 44 controls output of data stored in the memory cell array 40 to the data input/output terminals $I/O_1$ to $I/O_8$.

Chip enable signal input terminals CE1 and CE2 are connected to an AND gate 48, and these input terminals receive a chip enable signal for permitting the nonvolatile memory device to operate. An output signal from the AND gate 48 is applied to the address buffer 46, an AND gate 49, and an AND gate 50. The AND gate 49 applies a writing authorizing signal to the input data control circuit 43, and this signal, which is transferred from a terminal WE to the AND gate 49, permits data writing. The AND gate 50 applies a reading authorizing signal to the output data control circuit 44, and this signal, which is transferred from a terminal OE to the AND gate 50, permits data reading while no data is being written. The AND gate 50 receives the writing authorizing signal from the terminal WE, and therefore, it cannot output the reading authorizing signal received from the terminal OE, while data is being written.

Figure 2:
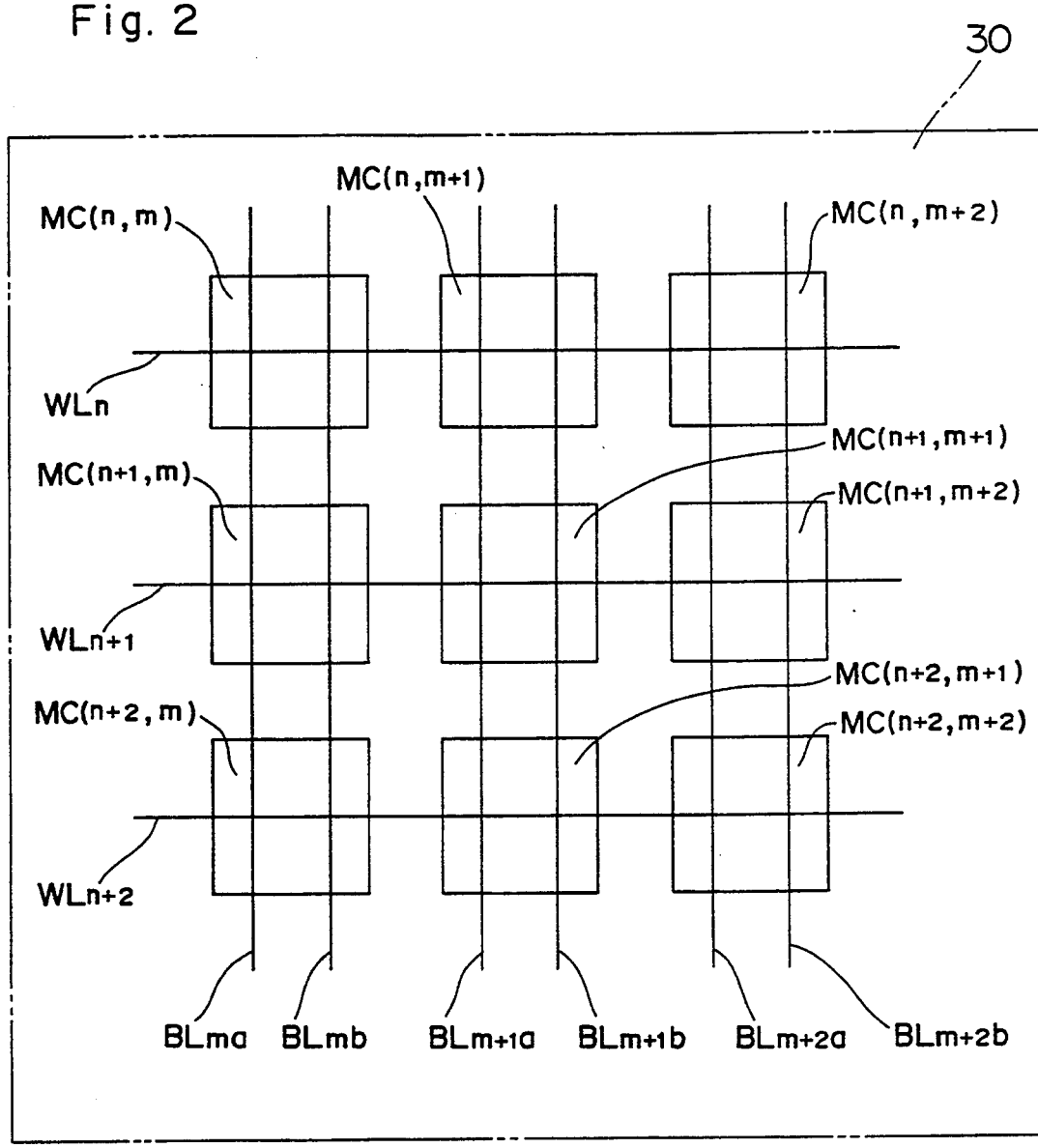
FIG. 2 is a schematic view showing a memory cell array in the nonvolatile memory device.

FIG. 2 is a schematic diagram illustrating a simplified concept of an inner structure of the memory cell array 40. On the semiconductor substrate 30, there are arranged a plurality of memory cells MC (n, m), MC (n, m+1), MC (n, m+2), MC (n+1, m), MC (n+1, m+1), MC (n+1, m+2), MC (n+2, m), MC (n+2, m+1), MC (n+2, m+2)—hereinafter, all referred to as "memory cell(s) MC" en bloc, in a matrix manner. Referring to FIG. 2, there are shown nine of the memory cells MC though, in practice, approximately $10^4$ to $10^7$ of the memory cells MC are arranged in a matrix manner on the semiconductor substrate A plurality of the memory cells MC in each row are individually connected to word lines $WL_n$, $WL_{n+1}$, $WL_{n+2}$—hereinafter, referred to as "word line(s) WL" en bloc, respectively. A plurality of the memory cells MC in each column are individually connected to pairs of bit lines $BL_m a$ and $BL_m b$; $BL_{m+1} a$ and $BL_{m+1} b$; $BL_{m+2} a$ and $BL_{m+2} b$—hereinafter, referred to as "bit line pair(s) or bit lines BLa and BLb", respectively. All the bit line pairs BLa and BLb are of complimentary lines. Specifically, in writing data, voltages corresponding to complementary binary data are applied to the bit lines of the bit line pair BLa and BLb, respectively, while in reading data, voltages corresponding to complementary binary data are exhibited in the bit line pair BLa and BLb, respectively.

Figure 3:
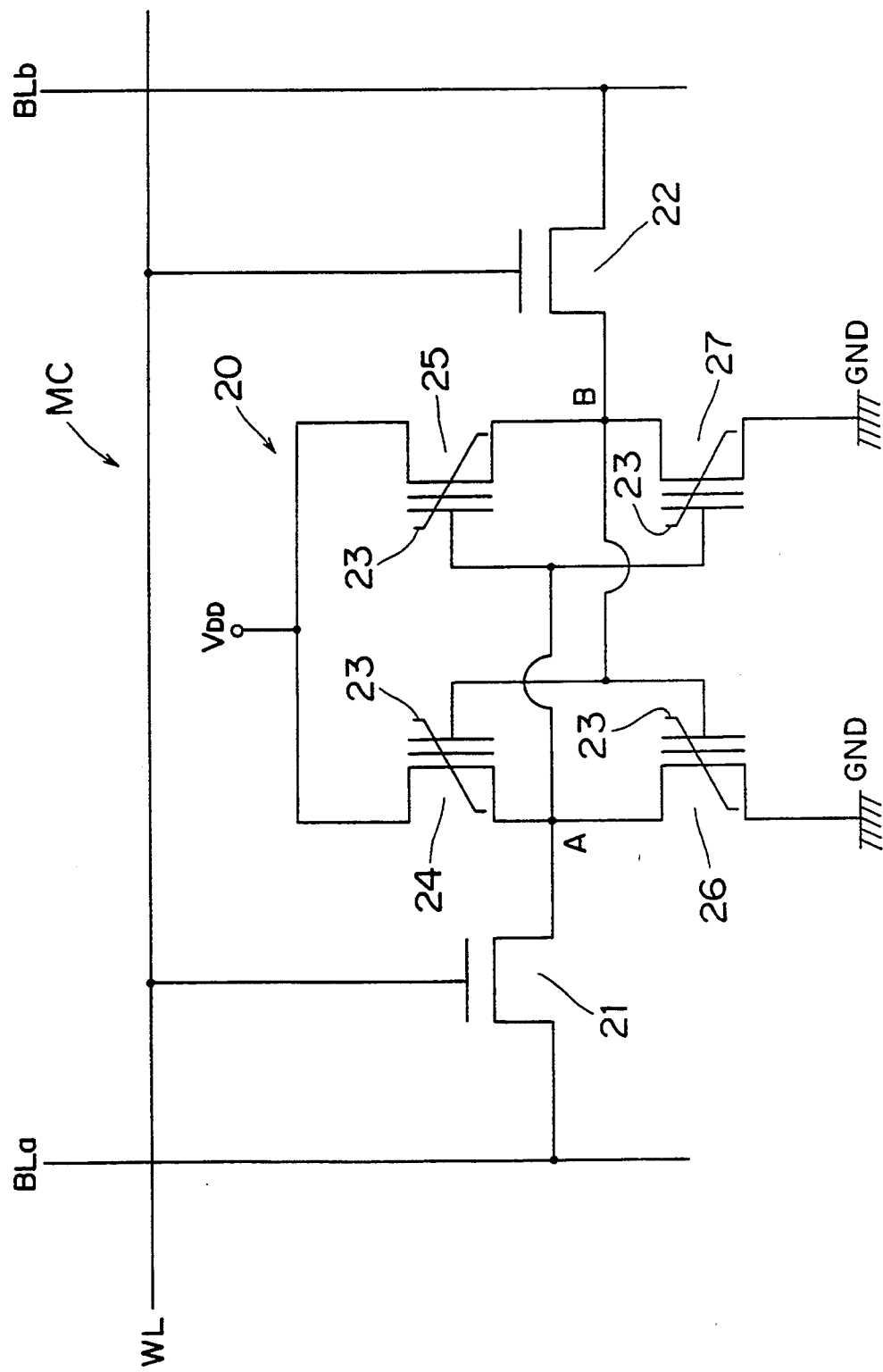
FIG. 3 is a circuit diagram showing a structure of memory cell.

FIG. 3 is an electric circuit diagram showing an inner structure of each of the memory cells MC. The memory cell MC includes a flip flop circuit 20 for storing data, and first and second FETs (Field Effect Transistors) 21 and 22 connected to the flip flop circuit 20 respectively to write/read data in/from it. This memory cell MC is similar in circuit structure to a memory cell of an SRAM. The FETs 21 and 22 are N channel transistors having enhanced voltage sustainability.

The flip flop circuit 20 consists of four (first to fourth) metal ferroelectric semiconductor field effect transistors (MFSFETs) 24, 25, 26 and 27 each of which has a ferroelectric gate film 23. The first and second MFSFETs 24 and 25 are P channel transistors while the third and fourth MFSFETs 26 and 27 are N channel transistors. The first and third MFSFETs 24 and 26 have their respective gates connected commonly to a source of the second writing/reading FET 22. The second and fourth MFSFETs 25 and 27 have their respective gates connected commonly to a source of the first writing/reading FET 21. The first and second MFSFETs 24 and 25 have their respective sources connected commonly to a $V_{DD}$ terminal. While the nonvolatile memory device is powered, supply voltage $V_{DD}$ (e.g., 5 V) is applied to the terminal $V_{DD}$. The MFSFET 24 has its drain connected to a drain of the third MFSFET 26, and the second MFSFET 25 has its drain connected to a drain of the fourth MFSFET 27. A node A between the MFSFETs 24 and 26 is connected to a line coupling the gates of the MFSFETs 25 and 27 with the first FET 21, and a node B between the MFSFETs 25 and 27 is connected to a line coupling the MFSFETs 24 and 26 with the second FET 22. The third and fourth MFSFETs 26 and 27 have their respective sources connected to the ground GND.

The first and second FETs 21 and 22 have their respective gates connected to one of the word lines WL. The first FET 21 has its drain connected to the bit line BLa while the second FET 22 has its drain connected to the bit line BLb.

The FETs 21 and 22 are adapted to have enhanced voltage sustainability so that voltage sufficient to invert the polarity of the ferroelectric gate film 23 can be transmitted.

Now, the data writing, reading and erasing in or from the memory cell MC will be described.

Writing

In writing data "1" in the memory cell MC, for example, data "1" is applied to the bit line BLa while data "0" is applied to the bit line BLb; that is, voltages corresponding to complementary binary data are applied from the sense switch 41 to the bit line pair BLa and BLb, respectively. For example, the voltage corresponding to the data "1" is identified with "High level (e.g., 5 V)" and the voltage corresponding to the data "0" is identified with "Low level (e.g., 0 V)". A relation between the binary data written in the memory cell MC and the data applied to the bit line pair BLa and BLb may be reversed to the above case. Also, a relation between the data "1", "0" and the levels of the applied voltages may be reversed to the above case.

In such a condition, transferring a writing signal (signal at High level) from the row decoder 45 to the word line WL allows the FETs 21 and 22 to turn on. As a result, the signal at High level corresponding to the data "1" is inputted to the gates of the second and fourth MFSFETs 25 and 27. Thus, the ferroelectric gate film 23 of each of the second and fourth MFSFETs 25 and 27 exhibits a polarization where its gate side portion assumes a negative polarity. This causes the P channel MFSFET 25 to be in its OFF-state and the N channel MFSFET 27 to be in its ON-state. On the other hand, a signal at Low level corresponding to the data "0", which is applied to the bit line BLb, is inputted via the second writing/reading FET 22 to the gates of the first and third MFSFETs 24 and 26. Thus, in the first and third MFSFETs 24 and 26, the respective ferroelectric gate film 23 exhibit a polarization where their respective gate side portions assume a positive polarity. This causes the P channel MFSFET 24 to be in its ON-state and the N channel MFSFET 26 to be in its OFF-state.

As a result, the node A exhibits the voltage $V_{DD}$ while the node B exhibits the ground potential. Then, after a potential of the word line WL is inverted into Low level to turn off the FETs 21 and 22, the first and third MFSFETs 24 and 26 receive the signal at Low level on their respective gates from the node B while the second and fourth MFSFETs 25 and 27 receive the signal at High level on their respective gates from the node A. Thus, the flip flop circuit 20 becomes stable with the first and fourth MFSFETs 24 and 27 in ON-state and the second and third MFSFETs 25 and 26 in OFF-state. Thus, the writing of the data "1" is completed.

In writing the data "0", data applied to the bit line pair BLa and BLb are reverse to the case described above. Thus, states of the MFSFETs 24, 25, 26 and 27 are also reverse to the case described above. That is, the node A is at Low level while the node B is at High level. In this way, the writing of the data "0" can be performed in a similar way to the writing of the data "1".

Reading

It now is assumed that the flip flop circuit 20 is in a stable state with the data "1" or "0" being written. In such a condition, applying a reading signal at High level to the word line WL allows the writing/reading FETs 21 and 22 to turn on. Consequently, a potential of the node A, which is output from the first and third MFSFETs 24 and 26, is transferred via the FET 21 to the bit line BLa, while a potential of the node B, which is output from the second and fourth MFSFETs 25 and 27, is transferred via the FET 22 to the bit line BLb. The potential difference between the bit lines BLa and BLb is inputted to a sensing circuit provided in the sense switch circuit 41, where it is determined if stored data is "0" or "1". Specifically, by examining which is higher in potential, the big line BLa or BLb, the reading of the stored data can be effected. A signal corresponding to the examination result is applied as read data to the input/output terminals $I/O_1$ through $I/O_8$ via the output data control circuit 44.

Erasing

Similar to an ordinary SRAM, erasing data is not particularly needed. In other words, all that which is required is a capability of writing data.

Data retaining

Data retention in the event where power goes OFF and $V_{DD}$ terminal is in a state of open circuit will now be described. In this memory cell MC, when power is in ON-state, data is retained similar to a memory cell which includes a flip flop circuit used in the ordinary SRAM. For example, keeping a stable stage of the flip flop circuit 20 of the memory cell MC enables data to be retained therein.

While power is OFF, turning the $V_{DD}$ terminal into the state of open circuit causes the potentials at the nodes A and B to be at Low level. However, even after the voltage $V_{DD}$ is lost, the ferroelectric gate film 23 of each of the MFSFETs 24, 25, 26 and 27 stay unchanged in its polarization because of residual polarization in the ferroelectric gate film 23. Thus, a channel in each of the MFSFETs 24, 25, 26 and 27 keeps a state just before power is OFF.

When power is ON again, one of the nodes A and B exhibits the voltage $V_{DD}$, and the other exhibits the ground level. Reappearance of the state just before power interruption can be performed in this way; that is, the memory cell designed as stated above can store data in the nonvolatile manner.

Then, a structure of the MFSFET and the theory of its operation will be described in detail.

Figure 4:
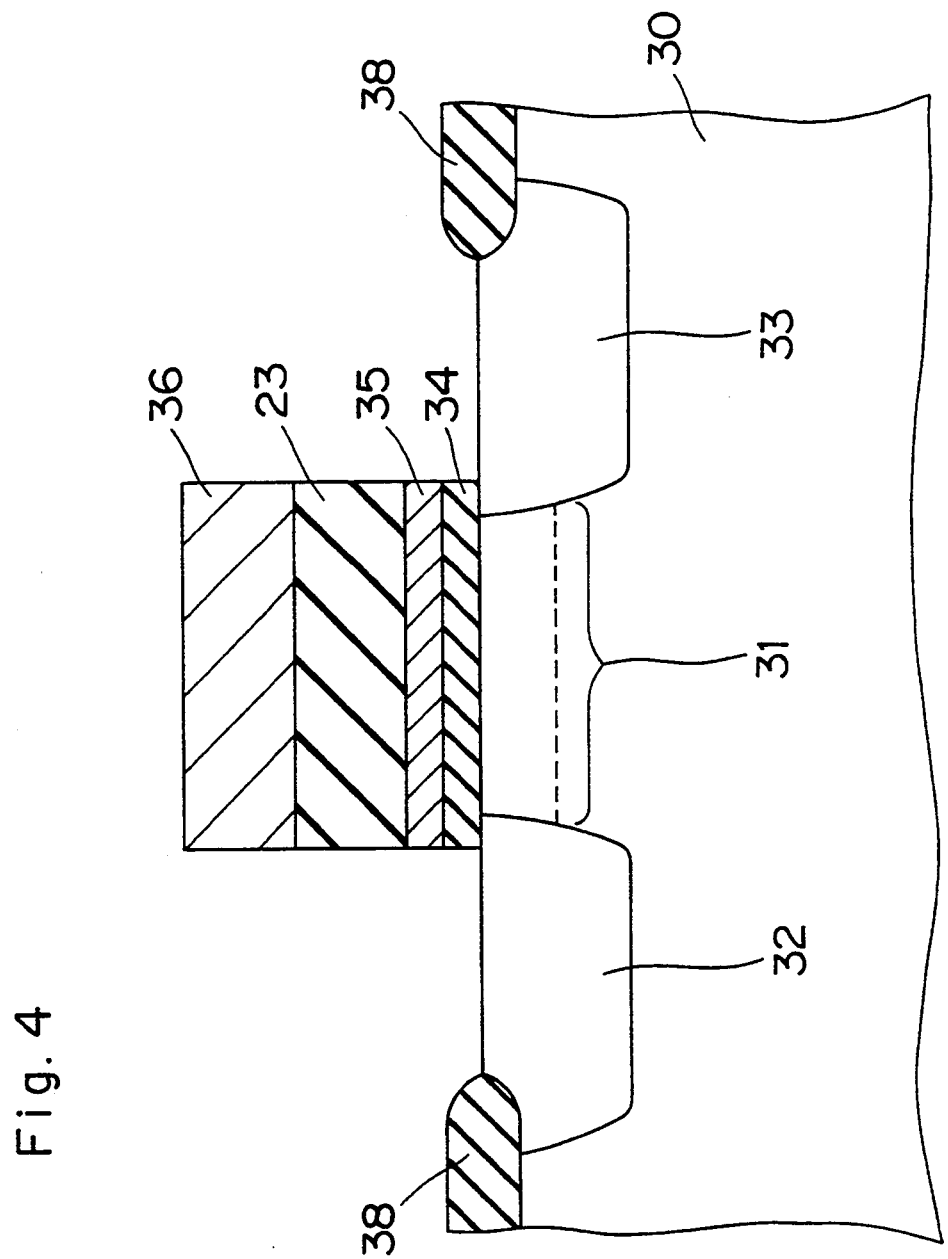
FIG. 4 is a sectional view showing a configuration of a field effect transistor having a ferroelectric gate film.

FIG. 4 is a sectional view showing the MFSFET. Close to a surface of a P-type semiconductor substrate 30, for example, an $N^+$-type source region 32 and an $N^+$-type drain region 33 are formed with a channel region 31 interposed between them. On the channel region 31, a gate insulating film 34, a metal layer 35, a ferroelectric gate film 23 and a gate electrode 36 are laminated in this order. They are formed to bridge over the channel region 31 between the source region 32 and the drain region 33. Reference numeral 38 denotes a field oxide film.

Figure 5:
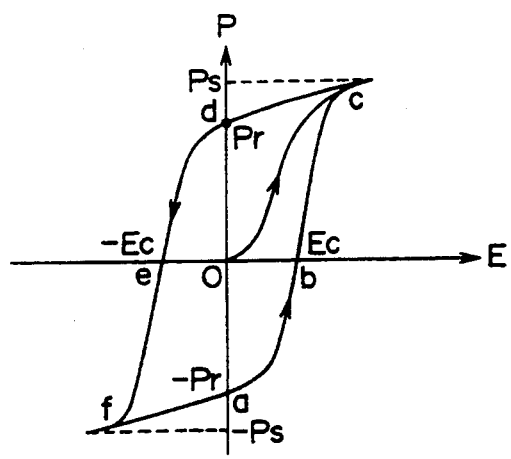
FIG. 5 is a characteristic view illustrating a relation between polarization in a ferroelectric film and voltage applied thereto.
Figure 6:
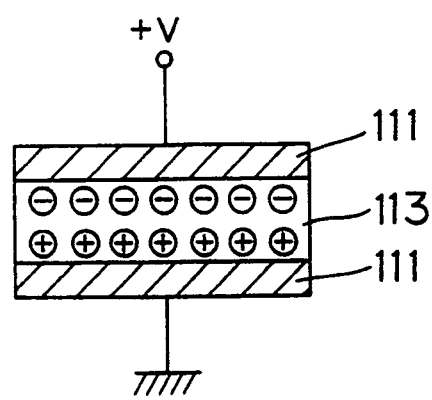
FIG. 6 is a diagram showing a state where a electric field is applied to the ferroelectric film.

FIG. 5 is a diagram showing variations in the polarization when an electric field is applied to a ferroelectric film. As shown in FIG. 6, a ferroelectric film 113 is sandwiched between a couple of plates 111 and 112, and it is now assumed that the plate 112 is grounded and voltage V is applied to the plate 111 to apply an electric field E to the ferroelectric film 113. A relation in this situation between the electric field E applied to the ferroelectric film 113 and the polarization P caused in the ferroelectric film 113 is shown in FIG. 5. In FIG. 5, it is defined that the polarization in the direction from the plate 111 toward the plate 112 is of positive property.

As the electric field E applied to the ferroelectric film 113 is increased by raising the voltage V, the polarization P increases until it is saturated at point c. Then, as the electric field E is decreased, the polarization P accordingly decreases though still remaining even if the electric field E is decreased to naught at point d. Pr in the graph designates the residual polarization in this situation. Moreover, as the voltage V is decreased into negative level to increase the electric field E in the reverse direction, the polarization P increases in the reverse direction until it reaches naught at point e where the electric field E at a negative level is applied. −Ec represents a level of the electric field E in this situation, which is called "negative coercive electric field. Furthermore, as the negative electric field E is increased (an absolute value is increased), the polarization P increases in the reverse direction until it is saturated at point f. As the negative electric field E is decreased in this situation, the polarization P still remains even if the electric field reaches naught at point a. −Pr represents the residual polarization in this situation. Increasing a positive electric field from this state, the polarization P is saturated at point c after entering a phase at point b where it reaches naught. A level Ec of the electric field at point b is called "positive coercive electric field". The term "coercive electric field" is an electric field required to eliminate the residual polarization.

In this way, the polarization P in the ferroelectric film assumes a hysteresis characteristic related to the electric field E. Such a hysteresis characteristic is utilized to store data in the memory cell MC in the nonvolatile manner.

Figure 7:
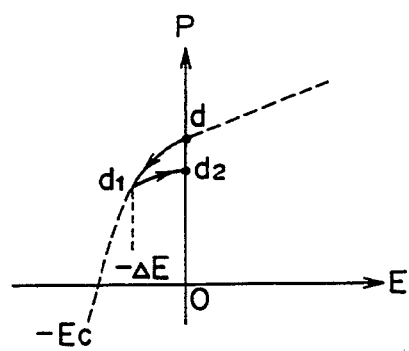
FIGS. 7(a), 7(b) and 7(c) are characteristic views illustrating relations between polarization in a ferroelectric film and voltage applied thereto.
Figure 7:
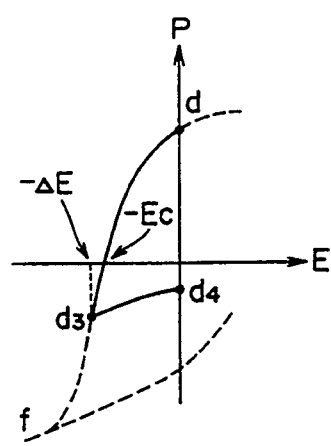
Figure 7:
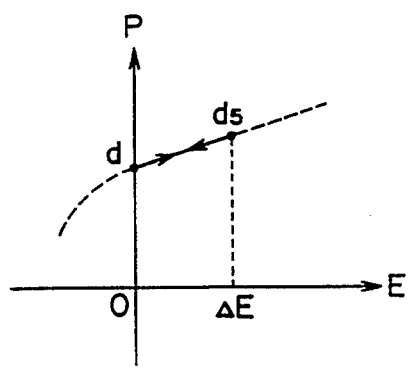

FIG. 7 contains graphs illustrating variations in the polarization P in the event where relatively small negative electric field $-\Delta E$ is applied to the ferroelectric film at point d in FIG. 5. When the ferroelectric film at point d is biased with $-\Delta E$ smaller than the coercive electric field −Ec (smaller in absolute value), the polarization P assumes a state at point $d_1$ as shown in FIG. 7(a). In this situation, when power to apply the electric field E is interrupted, the polarization P varies into a state at point $d_2$. After power interruption, although the polarization in the same direction as at point d is retained, its magnitude is smaller than that at point d.

On the other hand, as shown in FIG. 7(b), it is now assumed that the ferroelectric film is biased with the negative electric field $-\Delta E$ which is larger in absolute value than the negative coercive electric field −Ec but not large enough to vary the polarization into the state at point f. In such a situation, part of the ferroelectric film is inverted into a state at point $d_3$. With power interruption to apply the electric field E, the polarization varies into a state at point $d_4$.

FIG. 7(c) is a graph illustrating variations in the polarization P in the event where the relatively small positive electric field $\Delta E$ is applied to the ferroelectric film at point d. Applying the electric field $\Delta E$, the ferroelectric film varies into a state at point $d_5$. In this situation, with power interruption to apply the electric field E, the polarization recovers the state at point d and no variation is observed in its magnitude and direction.

As to the polarization at point a, a phenomenon similar to that which is shown in FIG. 7 appears.

Figure 8:
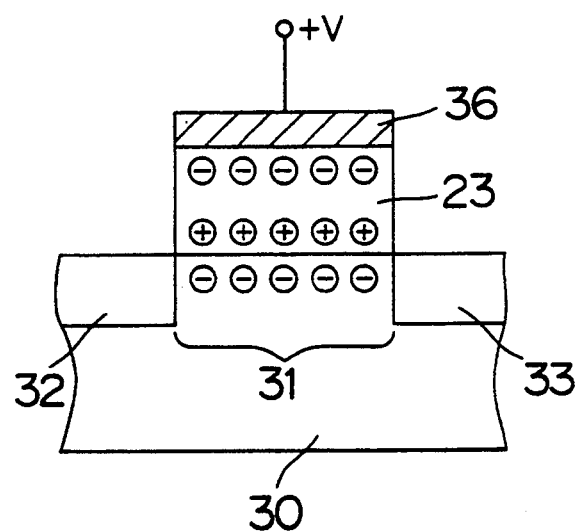
FIG. 8 is a schematic sectional view illustrating the operation of a field effect transistor having a ferroelectric film.

FIG. 8 is a schematic sectional view illustrating the theory of the operation of the MFSFET. When positive voltage +V is applied to the gate electrode 36, a polarization in a direction along the applied electric field is caused; that is, it is caused such polarization that the portion close to the gate electrode 36 assumes a negative polarity and the portion close to the semiconductor substrate 30 assumes a positive polarity. This allows electrons to be induced in a surface of the channel region 31, and a channel connecting the source region 32 and the drain region 33 is formed. This means the MFSFET turns on. This state goes retained after power is OFF because the residual polarization in the ferroelectric gate film 23 retains the channel in the channel region 31.

A negative electric field larger in absolute value than the negative coercive electric field is applied to the ferroelectric gate film 23, a polarization reverse in direction to the polarization shown in FIG. 8 is caused in the ferroelectric gate film 23. This allows holes to be induced in the surface of the channel region 31, and the channel disappears. This means the MFSFET turns off. This state is retained because of the residual polarization in the ferroelectric gate film 23 after power goes OFF.

Then, the writing of data in the memory cell MC will be described with reference to FIGS. 9A to 9E and FIGS. 10(a) to 10(d). FIGS. 9A to 9E are diagrams illustrating states of the second and fourth MFSFETs 25 and 27 in writing data in the flip flop circuit 20 of the memory cell MC. FIGS. 10(a)–10(d) contain graphs illustrating variations in the polarization in a ferroelectric gate film in each of the MFSFETs during the writing; FIG. 10(a) corresponds to the first MFSFET 24, FIG. 10(b) corresponds to the third MFSFET 26, FIG. 10(c) corresponds to the second MFSFET 25, and FIG. 10(d) corresponds to the fourth MFSFET 27.

An N well 301 and a P well 302 are formed in the semiconductor substrate 30. The MFSFET 25 is formed in the N well 301 while the MFSFET 27 is formed in the P well 302. Supply voltage $V_{DD}$ is applied commonly to a source region 311 of the MFSFET 25 and an N+-type impurity region 312 for controlling a potential of the N well 301. Also the ground potential is applied commonly to a source region 313 of the MFSFET 27 and a P+-type impurity region 314 for controlling a potential of the P well 302. The first and third MFSFETs 24 and 26 are configured in a similar manner.

Figure 9A:
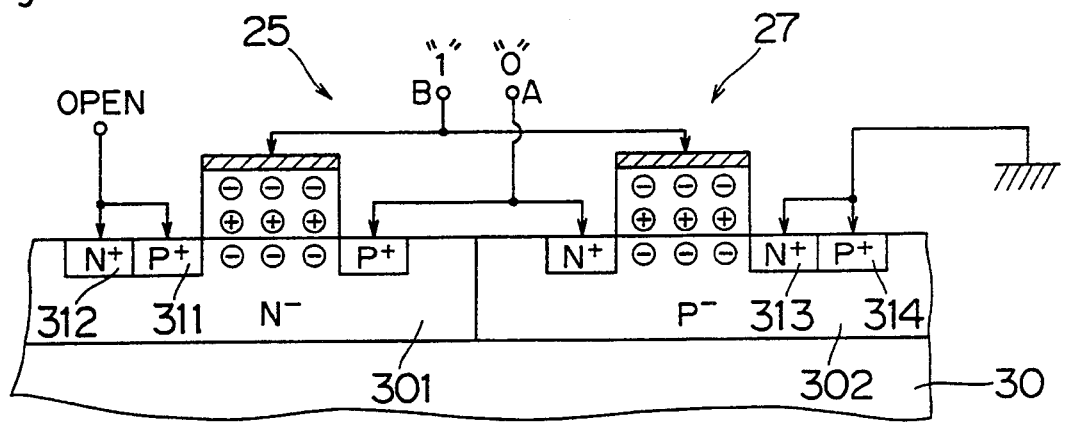
FIG. 9A is a sectional view showing a state of a flip flop circuit when power goes OFF.
Figure 10A:
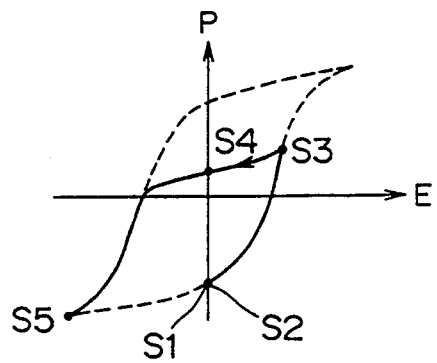
FIGS. 10(a) through 10(d) are characteristic views illustrating a transition of the polarization of a ferroelectric gate film of an MFSFET.
Figure 10B:
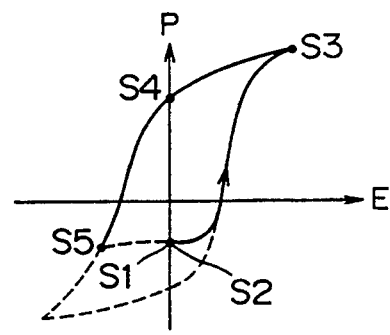
Figure 10C:
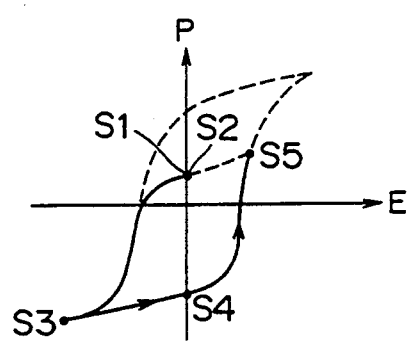
Figure 10D:
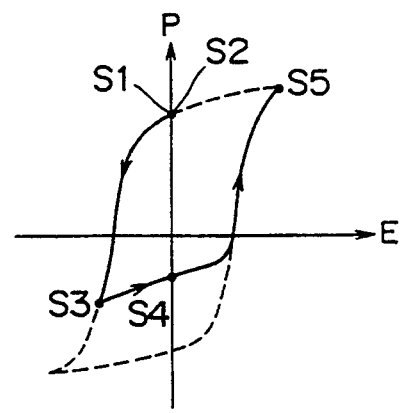

FIG. 9A illustrates a situation when power is OFF. The situation assumed in FIG. 9A is that outputs from the first and third MFSFETs 24 and 26 in the flip flop circuit 20 are retained as data "1" while outputs from the second and fourth FMSFETs 25 and 27 are retained as data "0". More precisely, simply the first and fourth MFSFETs 24 and 27 turn on while the second and third MFSFETS 25 and 26 turn off, and potentials corresponding to the individual data retained are not exhibited at the node A where the outputs from the first and third MFSFETs 24 and 26 appear and the node B where the outputs from the second and fourth MFSFETs 25 and 27 appear.

Point S1 in each of FIGS. 10(a) to 10(d) shows the polarization in the ferroelectric gate film 23 in each of the MFSFETs 24, 26, 25 and 27. FIG. 9A shows a condition at this time of the second and fourth MFSFETs 25 and 27.

It is now assumed that power is ON under the condition, the data "1" is applied to the bit line BLa while the data "0" is applied to the bit line BLb, and the FETs 21 and 22 turn on to start the writing. This situation is shown in FIG. 9B.

At this time, the data "1" is inputted to the gates of the second and fourth MFSFETs 25 and 27, while the data "0" is inputted to the gates of the first and third MFSFETs 24 and 26. Point S2 in each of FIGS. 10(a) to 10(d) shows the polarization of the ferroelectric gate film in each of the MFSFETs 24, 26, 25 and 27. As can be seen, nothing is changed from the state at point S1. Thus, the second and fourth MFSFETs 25 and 27 do not change from the condition of FIG. 9A, as shown in FIG. 9B.

Figure 9B:
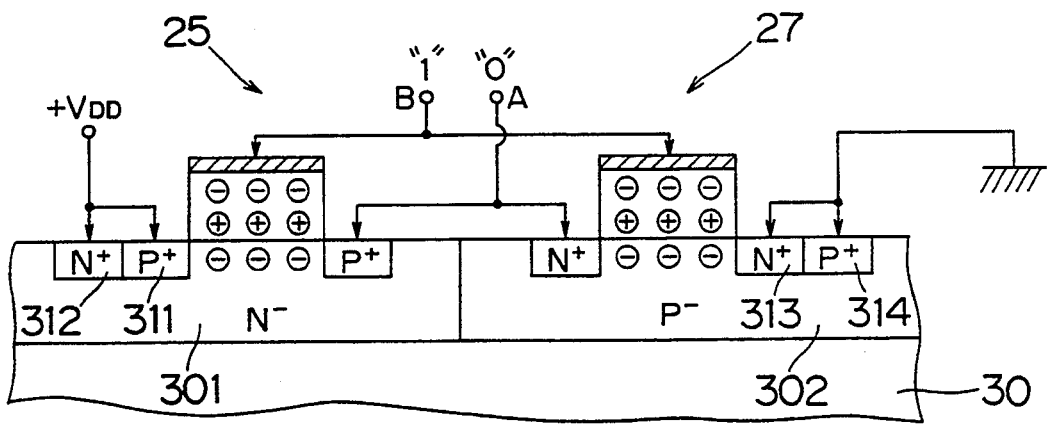
FIGS. 9B and 9C are sectional views showing states of the flip flop circuit during a writing operation.
Figure 9C:
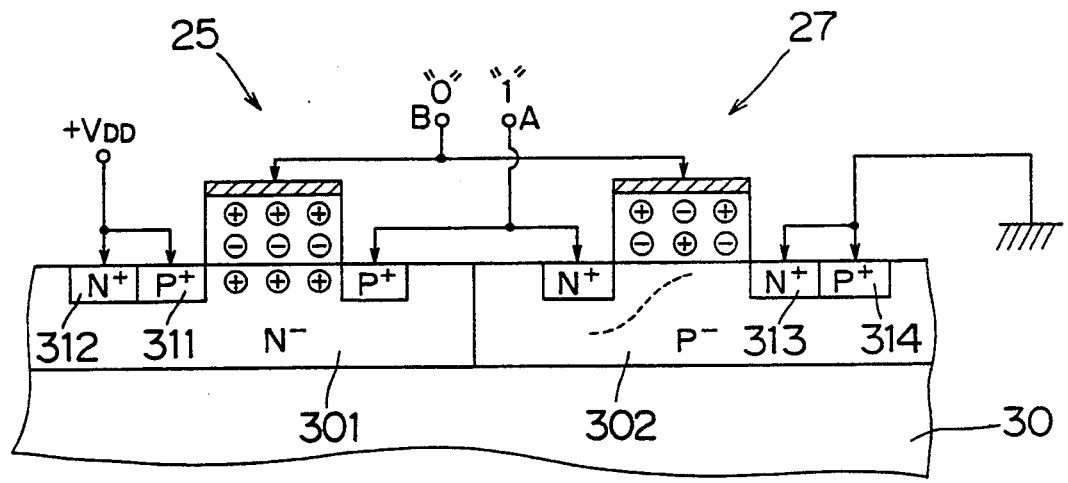

FIG. 9C shows a situation where, in order to write the data "0" in the memory cell MC under the condition shown in FIG. 9B, the data "0" is applied to the bit line BLa while the data "1" is applied to the bit line BLb, and the FETs 21 and 22 turn on to start the writing. Thus, signals at Low level corresponding to the data "0" are commonly applied to the gates of the second and fourth MFSFETs 25 and 27.

As a result, to the ferroelectric gate film 23 in the second MFSFET 25 a relatively large electric field is applied in a direction from the N well 301 toward its gate. Also, to the ferroelectric gate film 23 in the fourth MFSFET 27 a relatively small electric field is applied in a direction from the P well 302 toward its gate. Consequently, the polarization in the ferroelectric gate film 23 of the second MFSFET 25 varies to a condition at point S3 of FIG. 10(c). Under the condition, an inversion layer appears in a surface of the N well 301, and the MFSFET 25 varies from OFF-state to ON-state. The polarization in the ferroelectric gate film 23 of the fourth MFSFET 27 varies to a condition at point S3 of FIG. 10(d). Under the condition, the MFSFET 27 varies from ON-state to an imperfect OFF-state.

Variations in the polarization in the ferroelectric gate film 23 of the fourth MFSFET 27 will be described in more detail. Under the condition of FIG. 9B, an inversion layer is formed in a channel region of the MFSFET 27. When voltage at Low level is applied to the MFSFET 27 to develop negative electric charge in the ferroelectric gate film 23 close to the P well 302, a depletion layer extends in the channel region. Hence, the ground potential applied to the P well 302 is not delivered to the surface of the channel region. On the other hand, a signal at High level corresponding to the data "1" is applied to a drain region 315 of the MFSFET 27. Thus, the surface of the channel region exhibits a potential higher than the ground potential. In this way, a negative electric field slightly larger than the coercive electric field −Ec is applied to the ferroelectric gate film 23, and the polarization varies into a state at point S3 of FIG. 10(d).

Similarly, the polarization in the ferroelectric gate film 23 in the first MFSFET 24 varies into the state at point S3 of FIG. 10(a), and therefore, the MFSFET 24 turns into an imperfect OFF-state. Moreover, the polarization in the ferroelectric gate film 23 of the third MFSFET 26 varies into the state at point S3 of FIG. 10(b), and therefore, the MFSFET 26 is inverted from its OFF-state to its ON-state.

As a result, a status of the flip flop circuit 20 is inverted, and thus, the writing of the data "0" through the bit lines BLa and BLb is completed.

Figure 9D:
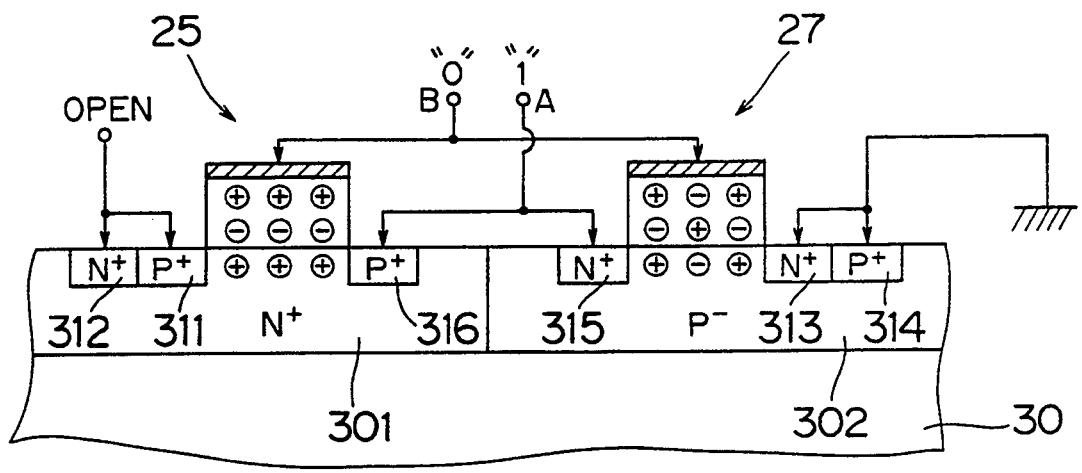
FIG. 9D is a sectional view showing a status of the flip flop circuit when power goes OFF.

FIG. 9D illustrates a state when power goes OFF under the condition shown in FIG. 9C. The ferroelectric gate film 23 of the MFSFETs 24, 26, 25 and 27 assumes a polarization similar to the state at point S3, as shown at point S4 in each of FIGS. 10(a) to 10(d).

Thus, nothing is changed in the second and fourth MFSFETs 25 and 27 from the condition of FIG. 9C, as shown in FIG. 9D.

Figure 9E:
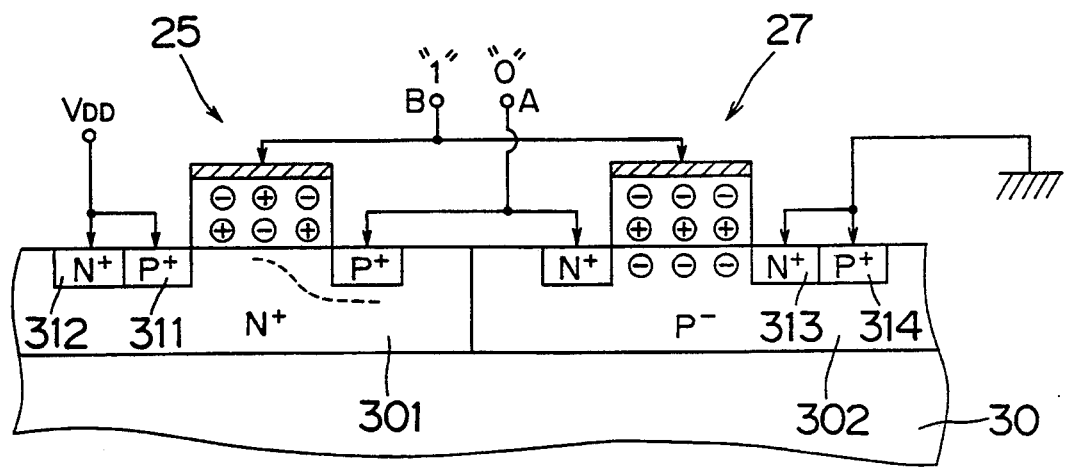
FIG. 9E is a sectional view showing a status of the flip flop in a writing operation.

FIG. 9E illustrates a state in the event where the data "1" is written after power is ON under the condition of FIG. 9D; that is the data "1" is applied to the bit line BLa while the data "0" is applied to the bit line BLb, and the FETs 21 and 22 turn on.

A polarization in the ferroelectric gate film 23 in each of the MFSFETs 24, 26, 25 and 27 varies into a state at point S5 shown in each of FIGS. 10(a) to 10(d). In the second MFSFET 25, an electric field slightly stronger than the coercive electric field Ec is applied, and a relatively weak polarization is caused. In the fourth MFSFET 27, applying voltage at High level corresponding to the data "1" to its gate and applying the ground potential to the P well 302, a strong electric field is applied to the ferroelectric gate film 23, and therefore, a strong polarization is caused. Thus, as shown in FIG. 9E, the second MFSFET 25 varies from its ON-state into a weak OFF-state while the fourth MFSFET 27 varies from a weak OFF-state into ON-state. On the other hand, the first MFSFET 24 varies from a weak OFF-state into an ON-state while the third MFSFET 26 varies from its ON-state into a weak OFF-state. Eventually a status of the flip flop circuit 20 is inverted, the reading of the data "1" from the bit line BLa is completed.

An electric field larger than the coercive electric field Ec can be applied to the second MFSFET 25 for the reason mentioned as follows. In the state shown in FIG. 9D, an inversion layer is formed in the channel region of the MFSFET 25. Then, voltage at High level is applied to the MFSFET 25 to develop positive electric charge in the ferroelectric gate film 23 close to the N well 301, and thus, a depletion layer extends in the channel region. Due to the depletion layer, supply voltage $V_{DD}$ applied to the N well 301 is not transmitted to the surface of the channel region. On the other hand, a signal at Low level corresponding to the data "0" is applied to a drain region 316 of the MFSFET 25. Thus, in the surface of the channel region, a potential lower than the voltage $V_{DD}$ appears, and this causes an electric field slightly larger than the coercive electric field Ec to be applied to the ferroelectric gate film 23.

In this embodiment, the memory cell MC includes the flip flop circuit 20 and is structured in a manner similar to a memory cell of an SRAM. The flip flop circuit 20 consists of four MFSFETs 24, 25, 26 and 27. Each of the MFSFETs 24, 25, 26 and 27 retains a current state of its channel because of the residual polarization in the ferroelectric gate film 23 after power goes OFF. This permits the MFSFETs 24, 25, 26 and 27 to maintain their respective ON/OFF-states just before power goes OFF. Thus, after power goes OFF, the flip flop circuit 20 retains the state just before power goes OFF, and eventually, data storage on a nonvolatile basis can be effected.

Unlike the prior art shown in FIG. 13, there is no need of providing a ferroelectric capacitor and so forth for accumulating electric charge other than the flip flop circuit. Thus, it is possible to considerably reduce an area of the memory cell, and also, its structure can be simplified.

In addition to that, even if stored data is read from the memory cell, the data is not destroyed, and therefore, the polarization inversion in the ferroelectric gate film does not occur excessively frequently. Thus, such a memory cell is reloadable sufficiently more frequently.

Figure 12:
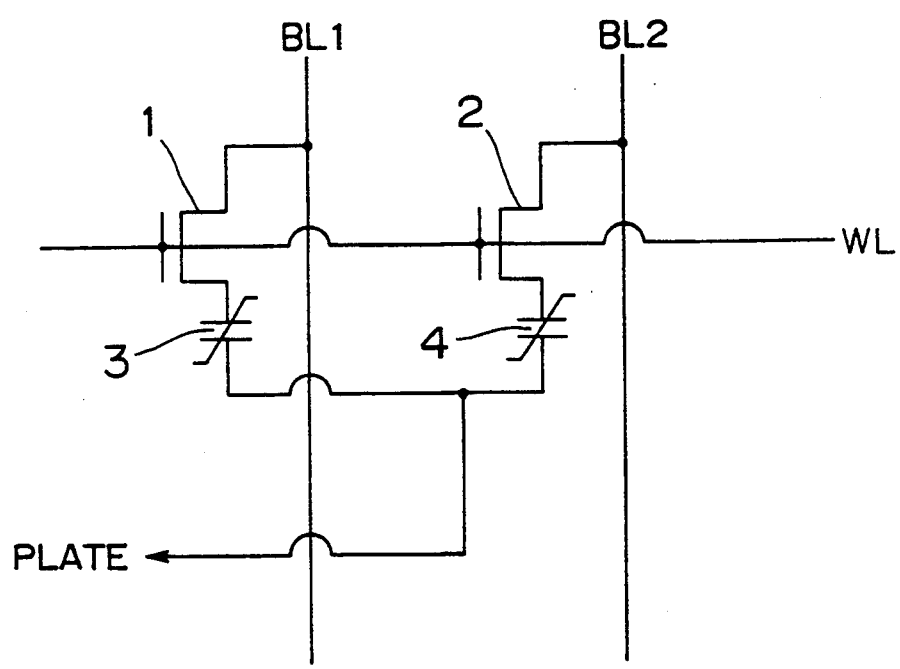
FIG. 12 is a circuit diagram showing a structure of a prior art memory cell similar in circuit arrangement to a memory cell of a DRAM.

Since the memory cell MC has a circuit arrangement similar to that of the memory cell of the SRAM, no refreshing is needed to reproduce stored contents, unlike a memory cell structure similar to the memory cell of the DRAM shown in FIG. 12. Thus, leakage current alone flows in the memory cell in standby, and no current flows to charge/discharge a capacitor for storage. Thus, the power demand in standby can be reduced.

Moreover, for peripheral circuits to the memory cell, ordinary peripheral circuits to the SRAM may be used without change in arrangement.

Since the writing/reading FETs 21 and 22 in the memory cell have enhanced voltage sustainability, sufficiently high voltage can be applied so as to invert the polarization in the ferroelectric gate film 23 of each of the MFSFETs 24, 25, 26 and 27.

While that which is presently deemed preferred has been described in the foregoing, it is not intended that the present invention be limited to the above embodiment.

Figure 11A:
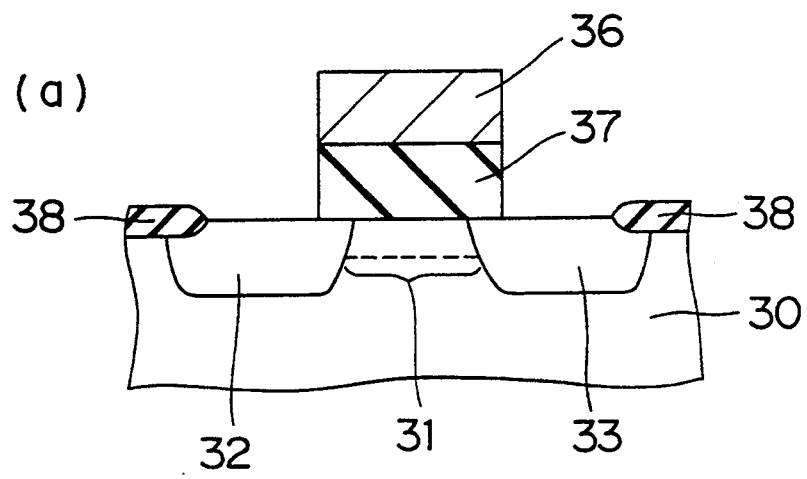
FIGS. 11(a) and 11(b) are sectional views showing other configurations of the MFSFET.
Figure 11B:
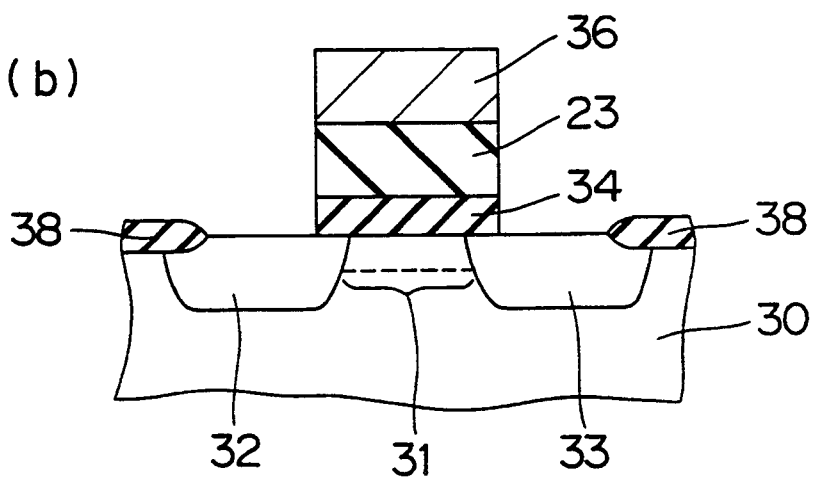

For example, other than the configuration of the MFSFET as shown in FIG. 4, another configuration where a gate electrode 36 is provided on a channel region 31 with a ferroelectric gate insulating film 37 interposed between them, as shown in FIG. 11(a), may be employed. Furthermore, still another configuration where a gate electrode 36 is provided on a channel region 31 with a lamination of a gate insulating film 34 and a ferroelectric gate film 23 interposed between them, as shown in FIG. 11(b), may be employed.

Since the writing/reading FETs 21 and 22 in the memory cell have enhanced voltage sustainability, the ferroelectric gate film can be sufficiently polarized if any type of the above MFSFETs is employed.

While the preferred embodiments of the present invention has been fully described, these are only for example to set forth the technical subjects of the present invention, and the present invention should not be construed in a narrow sense precisely defined by the embodiments. The true spirit and scope of the present invention should be defined simply by the description of the appended claims.

What is claimed is:

1. A nonvolatile memory device comprising
a flip flop circuit which includes (a) a first field effect transistor to which specified supply voltage is applied, (b) a second field effect transistor to which said specified supply voltage is applied, (c) a third field effect transistor having one end connected to the first field effect transistor and having the other end to which specified voltage is applied, and (d) a fourth field effect transistor having one end connected to the second field effect transistor and having the other end to which said specified voltage is applied; a first node between the first field effect transistor and the third field effect transistor being connected to gates of the second and fourth field effect transistors; a second node between the second field effect transistor and the fourth field effect transistor being connected to gates of the first and third field effect transistors; the first and third field effect transistors complementarily operating; the second and fourth field effect transistors complementarily operating; and the first, second, third and fourth field effect transistors having respective ferroelectric gate films;
data writing means, applying writing voltages corresponding to complementary data to said first and second nodes, and developing a polarization in each of said ferroelectric gate films of said first, second, third and fourth field effect transistors in individual specified directions, for writing data in said flip flop circuit;
data reading means detecting a potential difference between said first node and said second node for reading stored data;
a first reading/writing transistor connected to said first node;
a second reading/writing transistor connected to said second node; and
means for turning said first and second reading/writing transistors on in writing or reading data;
said data writing means applying writing voltage to the gates of said first, second, third and fourth field effect transistors through said first and second reading/writing transistors; and
said data reading means detecting a potential difference between said first node and said second node through said first and second reading/writing transistors.

2. A nonvolatile memory device according to claim 1, wherein said first and second reading/writing transistors have high voltage sustainability, so that the writing voltage, at a level sufficient to invert the polarity of the ferroelectric films of the first, second, third and fourth field effect transistors, is transmitted by said first and second reading/writing transistors.

3. A nonvolatile memory device according to claim 1, wherein each of said first, second, third and fourth field effect transistors includes
a source region and a drain region formed in a semiconductor substrate at an interval;
a channel region between said source region and said drain region;
a ferroelectric gate film formed on said channel region; and
a gate electrode formed on said ferroelectric gate film.

4. A nonvolatile memory device according to claim 3, wherein said ferroelectric gate film is formed in contact with said semiconductor substrate.

5. A nonvolatile memory device according to claim 3, wherein a gate insulating film is sandwiched between said ferroelectric gate film and said semiconductor substrate.

6. A nonvolatile memory device according to claim 5, wherein a metal layer is sandwiched between said ferroelectric gate film and said gate insulating film.

7. A nonvolatile memory device comprising
a plurality of memory cells arranged in a matrix manner on a semiconductor substrate, each comprised respectively of (A) a flip flop circuit which includes (a) a first field effect transistor to which specified supply voltage is applied, (b) a second field effect transistor to which said specified supply voltage is applied, (c) a third field effect transistor having one end connected to the first field effect transistor and having the other end to which specified voltage is applied, and (d) a fourth field effect transistor having one end connected to the second field effect transistor and having the other end to which said specified voltage is applied; a first node between the first field effect transistor and the third field effect transistor being connected to gates of the second and fourth field effect transistors; a second node between the second field effect transistor and the fourth field effect transistor being connected to gates of the first and third field effect transistors; the first and third field effect transistors complementarily operating; the second and fourth field effect transistors complementarily operating;

and the first, second, third and fourth field effect transistors having respective ferroelectric gate films; (B) a first reading/writing transistor connected to said first node; and (C) a second reading/writing transistor connected to said second node;

a word line means connected to gates of said first and second reading/writing transistors of each memory cell arranged in a row;

a first bit line connected to said first reading/writing transistors on their ends opposite to said first node, in the memory cells arranged in a column;

a second bit line connected to the second reading/writing transistors on their ends opposite to said second node, in the memory cells arranged in a column;

means for selecting any one of the memory cells;

means for applying voltage to said word line means to turn said first reading/writing transistor on in writing data in the selected memory cell or in reading data from the selected memory cell;

means for applying voltage to said word line means to turn said second reading/writing transistor on in writing data in the selected memory cell or in reading data from the selected memory cell;

data writing means for writing data in said flip flop circuit, said data writing means applying writing voltages corresponding to complementary data to the first and second bit lines, and developing a polarization in each of said ferroelectric gate films of said first, second, third and fourth field effect transistors in the selected memory cell in individual specified directions, for writing data in the selected memory cell; and data reading means for detecting a potential difference between the first bit line and the second bit line in reading data stored in the selected memory cell.

8. A nonvolatile memory device according to claim 7, wherein said word line means comprise a common word line to which the gates of said first and second reading/writing transistors are connected.

9. A nonvolatile memory device according to claim 7, wherein said first and second reading/writing transistors have high voltage sustainability, so that the writing voltage, at a level sufficient to invert the polarity of the ferroelectric films of the first, second, third and fourth field effect transistors, is transmitted by said first and second reading/writing transistors.

10. A nonvolatile memory device according to claim 7, wherein each of said first, second, third and fourth field effect transistors includes a source region and a drain region formed in a semiconductor substrate at an interval;

a channel region between said source region and said drain region;

a ferroelectric gate film formed on said channel region; and a gate electrode formed on said ferroelectric gate film.

11. A nonvolatile memory device according to claim 10, wherein said ferroelectric gate film is formed in contact with said semiconductor substrate.

12. A nonvolatile memory device according to claim 10, wherein a gate insulating film is sandwiched between the ferroelectric gate film and the semiconductor substrate.

13. A nonvolatile memory device according to claim 12, wherein a metal layer is sandwiched between the ferroelectric gate film and the gate insulating film.

* * * * *